(12) United States Patent
Huang

(10) Patent No.: US 7,723,787 B2
(45) Date of Patent: May 25, 2010

(54) SOI MOSFET DEVICE WITH REDUCED POLYSILICON LOADING ON ACTIVE AREA

(75) Inventor: Shao-Chang Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/250,049

(22) Filed: Oct. 13, 2008

(65) Prior Publication Data

US 2009/0039429 A1 Feb. 12, 2009

Related U.S. Application Data

(62) Division of application No. 11/053,461, filed on Feb. 8, 2005, now Pat. No. 7,453,122.

(51) Int. Cl.
*H01L 29/786* (2006.01)
(52) U.S. Cl. .................. 257/347; 257/E27.112
(58) Field of Classification Search .......... 257/347, 257/348, E21.538, E33.002, E27.112
See application file for complete search history.

(56) References Cited

U.S. PATENT DOCUMENTS

| 5,160,989 | A | 11/1992 | Houston |
| 5,489,792 | A | 2/1996 | Hu et al. |
| 5,821,575 | A | 10/1998 | Mistry et al. |
| 5,936,278 | A | 8/1999 | Hu et al. |
| 6,344,671 | B1 | 2/2002 | Mandelman et al. |
| 6,677,645 | B2 | 1/2004 | Bryant et al. |
| 6,828,630 | B2 | 12/2004 | Park et al. |
| 6,953,979 | B1 | 10/2005 | Yamaguchi et al. |
| 7,005,705 | B2 | 2/2006 | Maeda et al. |
| 2002/0110989 | A1 | 8/2002 | Yamaguchi et al. |
| 2002/0185687 | A1* | 12/2002 | Koh et al. .................. 257/347 |

OTHER PUBLICATIONS

CN Aug. 17, 2007.

* cited by examiner

*Primary Examiner*—Sue Purvis
*Assistant Examiner*—Selim Ahmed
(74) *Attorney, Agent, or Firm*—Thomas, Kayden, Horstemeyer & Risley

(57) ABSTRACT

Silicon-on-insulator (SOI) devices with reduced polysilicon loading on an active area uses at least one dielectric layer resistant to silicidation to separate at least one body contact region from source/drain regions, thus reducing gate capacitance and improving device performance. The SOI devices may be used in full depletion type transistors or partial depletion type transistors.

8 Claims, 22 Drawing Sheets

SOI MOSFET DEVICE WITH REDUCED POLYSILICON LOADING ON ACTIVE AREA

CROSS-REFERENCE TO RELATED APPLICATION

The present application is a division of U.S. patent application Ser. No. 11/053,461, filed on Feb. 8, 2005.

TECHNICAL FIELD

The present invention relates to semiconductor devices and fabrication methods thereof, and particularly to silicon-on insulator (SOI) devices and methods for fabricating the same.

BACKGROUND

Silicon-on-insulator (SOI) technology has become an increasingly important technique utilized in the fabrication and production of semiconductor devices. SOI technology deals with the formation of transistors in a relatively thin monocrystalline semiconductor layer, which overlays an insulating layer. In other words, the active devices are formed in a thin semiconductor on an insulator layer rather than in the bulk semiconductor of the device. SOI technology makes possible certain performance advantages, such as the reduction of parasitic elements present in integrated circuits formed in bulk semiconductors, useful in high performance and high-density integrated circuits. SOI technology further allows for the mapping of standard advanced technologies into a SOI technology without significant modifications, and exhibits its advantages for higher speed, lower power consumption and better radiation immunity due to the enhanced isolation of buried oxide layers.

On a typical SOI transistor, however, the body is generally isolated from the silicon substrate and usually kept floating, and this may result in serious problems for current-sensitive circuit applications. The body retains charges and some of the electrical properties from the last time the transistor was used, interfering with subsequent use of the device. A variety of solutions have been proposed to address the problems associated with the SOI semiconductor device. For example, the use of a body contact in the SOI device addresses this problem, and also allows the threshold voltage to be changed so that standby power can be reduced for low-power applications. The body contact in the SOI device has conventionally been made by the use of a T-shaped or a H-shaped polysilicon structure on an active area, thereby creating three distinct regions including a source region, a drain region, and a body contact region.

FIG. 1A is a top view illustrating a conventional T-shaped polysilicon structure with a body contact. FIG. 1B is a cross-sectional view along line 1B-1B in FIG. 1A. FIG. 1C is a cross-sectional view along line 1C-1C in FIG. 1A. An SOI substrate 10, typically including a silicon base layer, a buried oxide layer and a semiconductor silicon layer (e.g., a P$^-$ type layer), is provided with an active area 12 defined by a shallow trench isolation (STI) structure 14 formed in the semiconductor silicon layer over the buried oxide layer. A T-shaped polysilicon layer 16 is formed on the active area 12, thus creating three distinct regions including a source region 17, a drain region 18, and a body contact region 20 in the semiconductor silicon layer. For an example of NMOS device, the source region 17 and the drain region 18 are N$^+$-type regions, and the body contact region 20 is a P$^+$-type region. FIG. 2A is a top view illustrating a conventional H-shaped polysilicon structure with body contacts. FIG. 2B is a cross-sectional view along line 2B-2B in FIG. 2A. FIG. 2C is a cross-sectional view along line 2C-2C in FIG. 2A. Explanation of the same or similar portions to the description in FIGS. 1A-1C is omitted herein. By comparison, the T-shaped polysilicon layer 16 is replaced with a H-shaped polysilicon layer 16", thus creating four distinct regions. The conventional approaches increase parasitic diode due to increased P$^+$/P$^-$/N$^+$ junction areas, thus improving the current sink capacity in the body contact region. The T-shaped or H-shaped polysilicon layer, however, including a polysilicon gate portion and a polysilicon dummy portion, induces high gate capacitance, usually causing poor performance.

Therefore, there exists a need for a SOI MOSFET device that allows a reduction of polysilicon loading on the active area to overcome problems arising from high gate capacitance.

SUMMARY OF THE INVENTION

Embodiments of the present invention include silicon-on-insulator (SOI) devices with reduced polysilicon loading on an active area, in which at least one dielectric layer resistant to silicidation is employed to separate at least one body contact region from source/drain regions, thus reducing gate capacitance and improving device performance. The SOI devices may be used in full depletion type transistors or partial depletion type transistors.

In one aspect, the present invention provides a silicon-on-insulator (SOI) device on a SOI substrate having a semiconductor layer overlying an insulator layer. At least one gate electrode layer is over the semiconductor layer of an active area. A source region and a drain region are in the semiconductor layer of the active area and separated from each other by the gate electrode layer. A dielectric layer resistant to silicidation is over the semiconductor layer of the active area. A body contact region is in the semiconductor layer of the active area and separated from the source region and the drain region by the dielectric layer resistant to silicidation.

In another aspect, the present invention provides a silicon-on-insulator (SOI) chip. A SOI substrate having a semiconductor layer overlying an insulator layer. At least two dielectric layers resistant to silicidation are over the semiconductor layer of an active area. At least one transistor located between the dielectric layers resistant to silicidation includes a gate electrode layer over the semiconductor layer, and source/drain regions in the semiconductor layer. At least two body contact regions are in the semiconductor layer of the active area and separated from the source/drain regions by the dielectric layers resistant to silicidation.

In another aspect, the present invention provides a method of forming a silicon-on-insulator (SOI) device. At least one gate electrode layer and at least one dielectric layer resistant to silicidation are formed over a semiconductor layer of an active area. A source region and a drain region are formed in the semiconductor layer of the active area, and the gate electrode layer separates the source region and the drain region. At least one body contact region is formed in the semiconductor layer of the active area, and the dielectric layer resistant to silicidation separates the body contact region from the source region and the drain region.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1A:
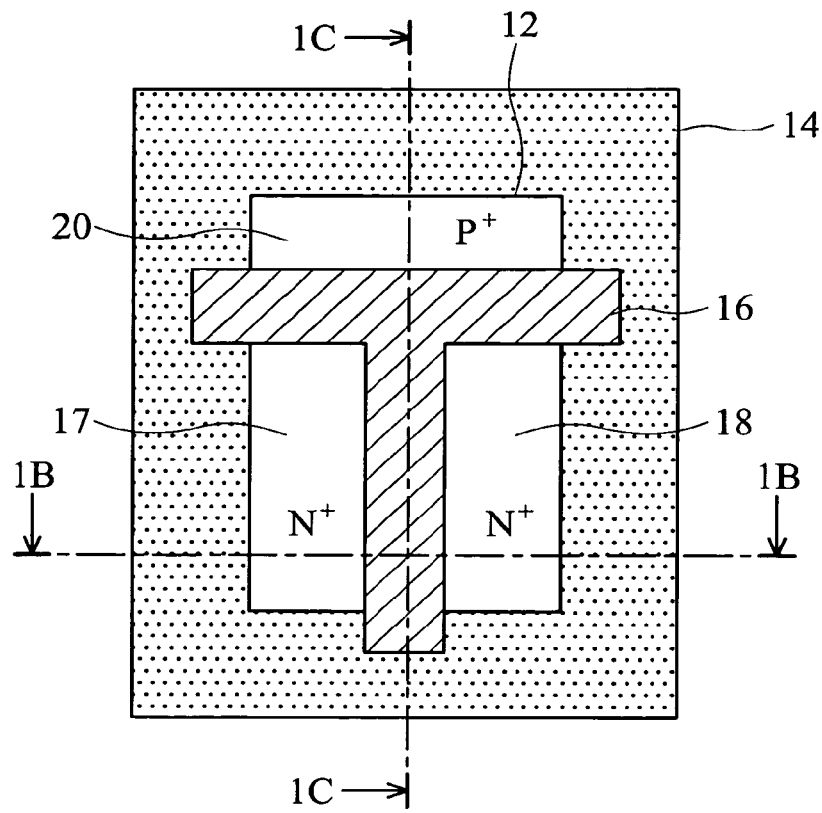
FIG. 1A is a top view illustrating a conventional T-shaped polysilicon structure with a body contact.
Figure 1B:
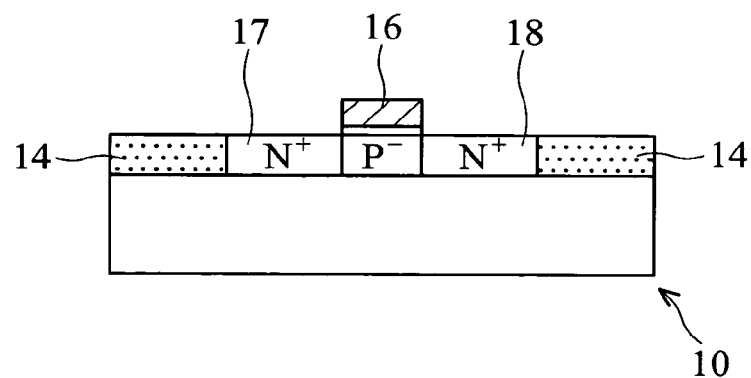
FIG. 1B is a cross-sectional view along line 1B-1B in FIG. 1A.
Figure 1C:
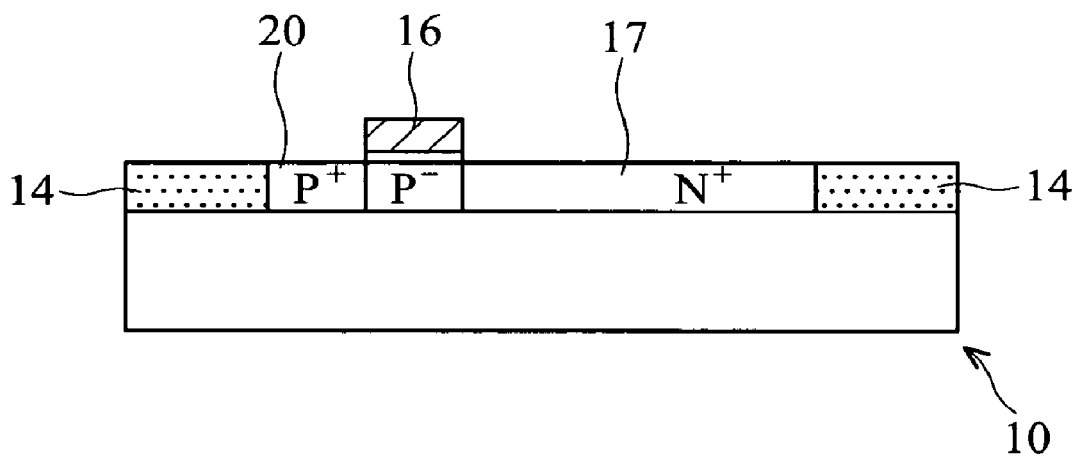
FIG. 1C is a cross-sectional view along line 1C-1C in FIG. 1A.
Figure 2A:
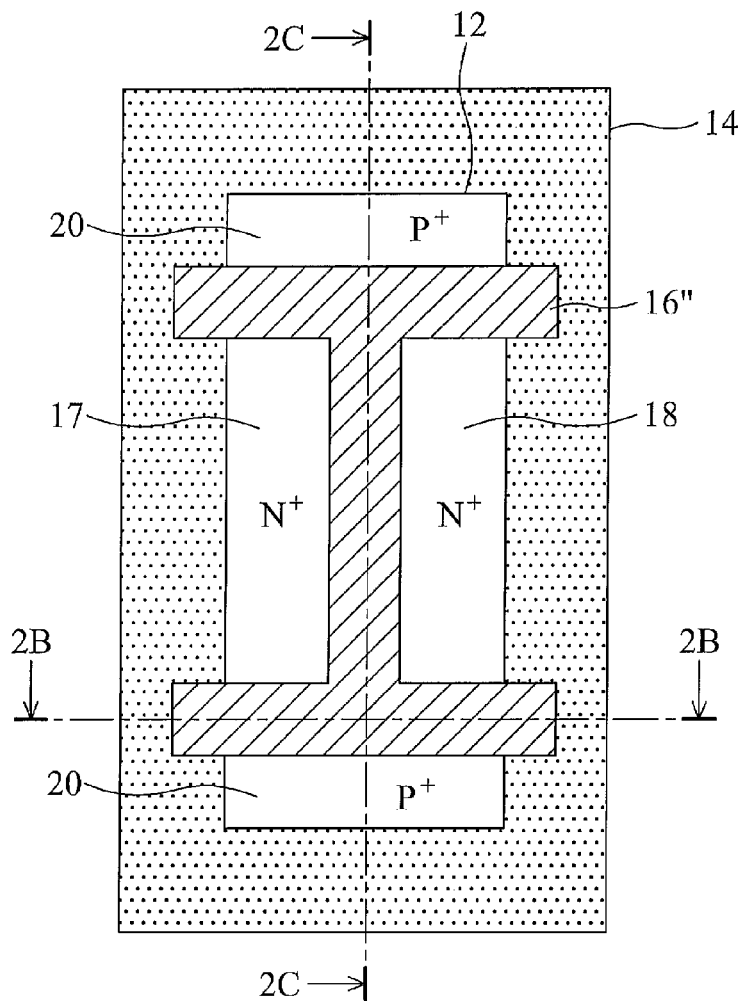
FIG. 2A is a top view illustrating a conventional H-shaped polysilicon structure with body contacts.
Figure 2B:
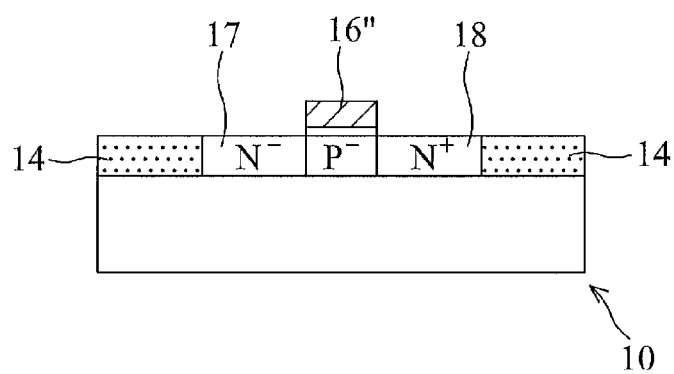
FIG. 2B is a cross-sectional view along line 2B-2B in FIG. 2A.
Figure 2C:
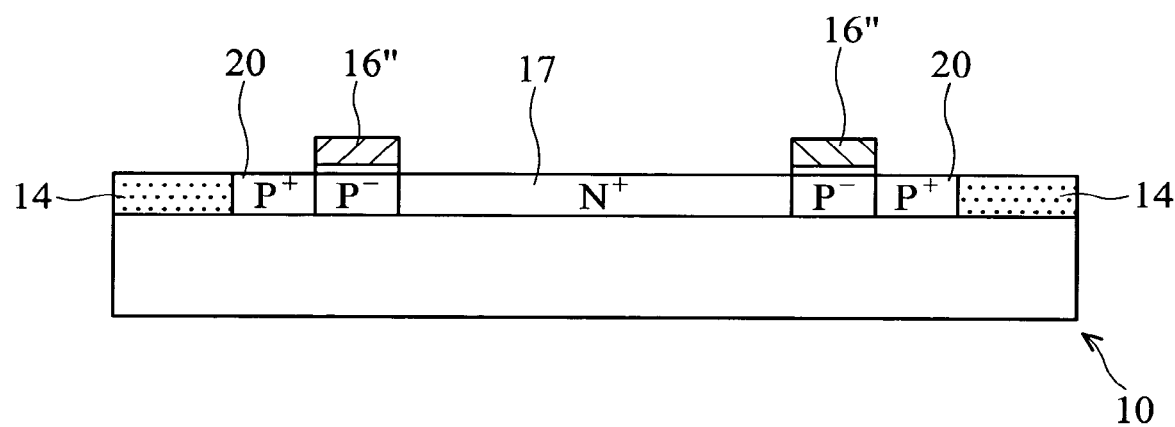
FIG. 2C is a cross-sectional view along line 2C-2C in FIG. 2A.

Embodiments of the present invention provide SOI devices with a reduction of polysilicon loading on an active area where a dielectric layer resistant to silicidation, such as a RPO (resist protective oxide) layer, is used to replace the polysilicon dummy portion of the conventional T-shaped or H-shaped polysilicon structure, thus reducing gate capacitance and improving device performance. Fabricating methods for such SOI devices are more facile than the conventional body contact process, and there is no need for generating extra layout area. Embodiments of the present invention provide several modifications of the RPO pattern, which may be used in full depletion type SOI transistors or partial depletion type SOI transistors.

As used throughout this disclosure, the term "a dielectric layer resistant to silicidation" refers to a protective layer that is used where a salicide process is not desired to take place. It may be desired to perform the salicide process on one part of a wafer while protecting another portion of the wafer from silicidation. Except for oxide (such as RPO), any other material that protects the semiconductor device from silicidation may be used as the dielectric layer resistant to silicidation, for example nitride-containing dielectric materials, silicon nitride, silicon oxynitride or the like.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 3A:
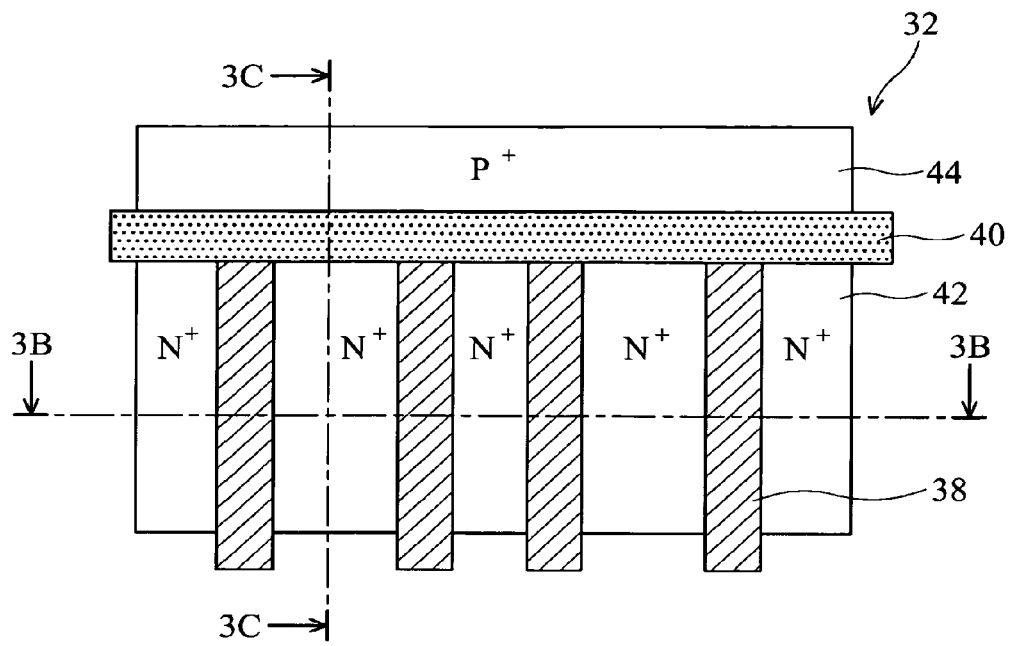
FIG. 3A is a top view illustrating a RPO layer used to distinguish a body contact region from source/drain regions.
Figure 3B:
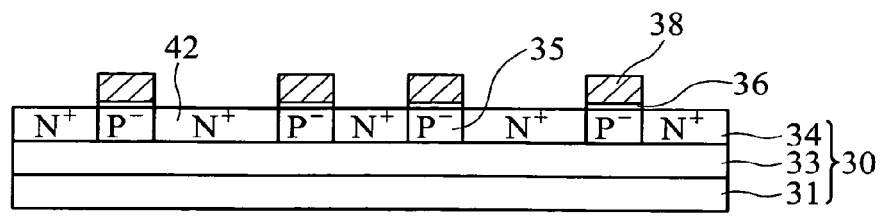
FIG. 3B is a cross-sectional diagram along line 3B-3B of FIG. 3A.
Figure 3C:
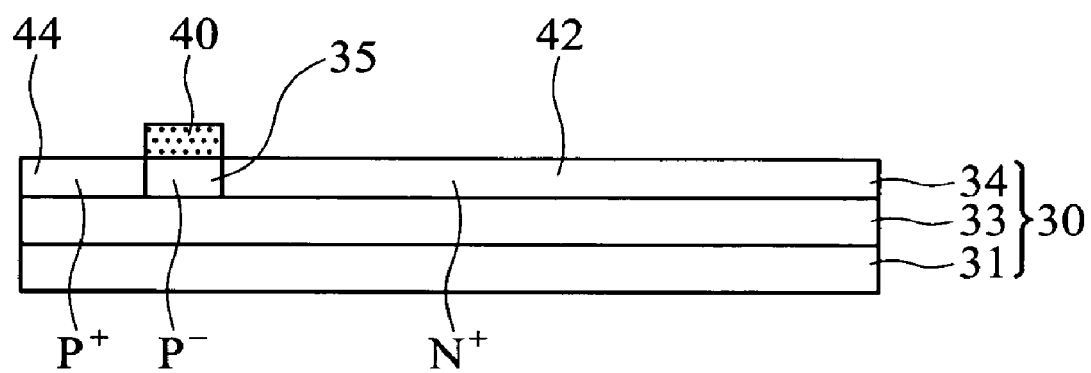
FIG. 3C is a cross-sectional diagram along line 3C-3C of FIG. 3A.

Herein, a SOI MOSFET device with a body contact region according to an exemplary embodiment of the present invention is illustrated. FIG. 3A is a top view illustrating a RPO layer used to distinguish a body contact region from source/drain regions, FIG. 3B is a cross-sectional diagram along line 3B-3B of FIG. 3A, and FIG. 3C is a cross-sectional diagram along line 3C-3C of FIG. 3A. A SOI substrate 30 is provided with an active area 32 defined by an isolation structure that is omitted for clarity. The SOI substrate 30 is comprised of a base substrate 31, a buried insulator layer 33 and a semiconductor layer 34. The base substrate 31 may comprise silicon, gallium arsenide, gallium nitride, strained silicon, silicon germanium, silicon carbide, carbide, diamond, an epitaxy layer, and/or other materials. The buried insulator layer 33 may comprise silicon oxide, silicon nitride, silicon oxynitride, and/or other dielectric materials. The semiconductor layer 34 may comprise silicon, gallium arsenide, gallium nitride, strained silicon, silicon germanium, silicon carbide, carbide, diamond, and/or other materials. The buried insulator layer 33 and the semiconductor layer 34 may be formed using various SOI technologies. For example, the buried insulator layer 33 may be formed on a semiconductor wafer by a process referred to as separation by implanted oxygen (SI- MOX). The SIMOX technology is based on ion-implanting a high-dose of oxygen ions into a silicon wafer, such that the peak concentration lies beneath the silicon surface. After implantation the wafer is subjected to a high-temperature anneal to form a continuous stoichiometric subsurface-layer of silicon dioxide. Thus formed dielectric layer 33, also referred to as buried oxide (BOX), electrically separates the semiconductor layer 34 and the base substrate 31. After the SOI process, isolation structures, such as shallow trench isolation (STI) structures, may be formed in the semiconductor layer 34 for defining element-to-element active areas 32.

At least one gate structure is then formed on the active area 32 through advances in deposition, lithography and masking techniques and dry etching processes. The gate structure includes a gate dielectric layer 36 and a gate electrode layer 38. The active area 32 may include one or more gate structures separated from each other with an appropriate distance allowed by a predetermined design rule. In one embodiment, the gate dielectric layer 36 is a silicon oxide layer with a thickness chosen specifically for the scaling requirements of the SOI MOSFET device technology, for example, formed through a thermal oxidation process or a chemical vapor deposition (CVD) process. It is to be appreciated other well-known gate dielectric material such as oxides, nitrides, and combinations thereof. In one embodiment, the gate electrode layer 38 is a polysilicon layer with a gate length chosen specifically for the scaling requirements of the SOI MOSFET device technology, for example deposited through Low Pressure CVD (LPCVD) methods, CVD methods and Physical Vapor Deposition (PVD) sputtering methods employing suitable silicon source materials. If desired the polysilicon layer may be ion implanted to the desired conductive type. It is to be appreciated other well-known gate electrode material such as metal, metal alloys, single crystalline silicon, or any combinations thereof. It is noted that each gate electrode layer 38 is a stripe-shaped polysilicon pattern without adding a dummy polysilicon portion as an end-to-end connection as compared with the conventional T-shaped or H-shaped polysilicon pattern, therefore the polysilicon-occupied area on the active area 32 is significantly decreased to achieve a reduction of gate capacitance and an improvement of device performance.

Following the formation of gate structures, an RPO layer 40, source/drain regions 42 and a body contact region 44 are formed by the use of any well-known processes. In one embodiment, the RPO layer 40 formed on the active area 32 is a stripe-shaped dielectric layer across ends of the gate electrode layers 38 respectively, thus a combination of the RPO layer 40 and the gate electrode layers 38 can create three separated regions including the source region 42, the drain region 42 and the body contact region 44 formed in the semiconductor layer 34. The RPO layer 40 may be deposited through CVD methods and then patterned by using well-known lithography, masking and etching processes. In one embodiment, the RPO layer 40 may comprise TEOS oxide or silicon oxide ($SiO_x$). In one embodiment, the RPO layer 40 may be replaced by using nitride-containing dielectric materials, such as silicon nitride, silicon oxynitride or the like. Alternatively, the RPO layer 40 may be replaced by using any other material suitable for dielectric layer resistant to silicidation. The source/drain regions 42 and body contact regions 44 may be formed by the use of ion implantation processes performed with various dopant species into the semiconductor layer 34. Typically, the dopant for the body contact region 44 has the same polarity as the body (e.g., the region 35 of the semiconductor layer 34 underlying the gate electrode layer 38 and the RPO layer 40), and has a doping concentration greater than that of the body. The polarity of dopant for the body contact region 44 is different from that of the source/drain regions 44. In one exemplary embodiment of N-channel MOSFET device as depicted in FIGS. 3A to 3C, the source/drain regions 42 are $N^+$ regions, the body contact region 44 is a $P^+$ region, and the region 35 is a $P^-$ region. If P-channel MOSFET devices are desired, the source/drain regions are $P^+$ regions, the body contact region is a $N^+$ region, and the body region is a $N^-$ region.

Figure 4A:
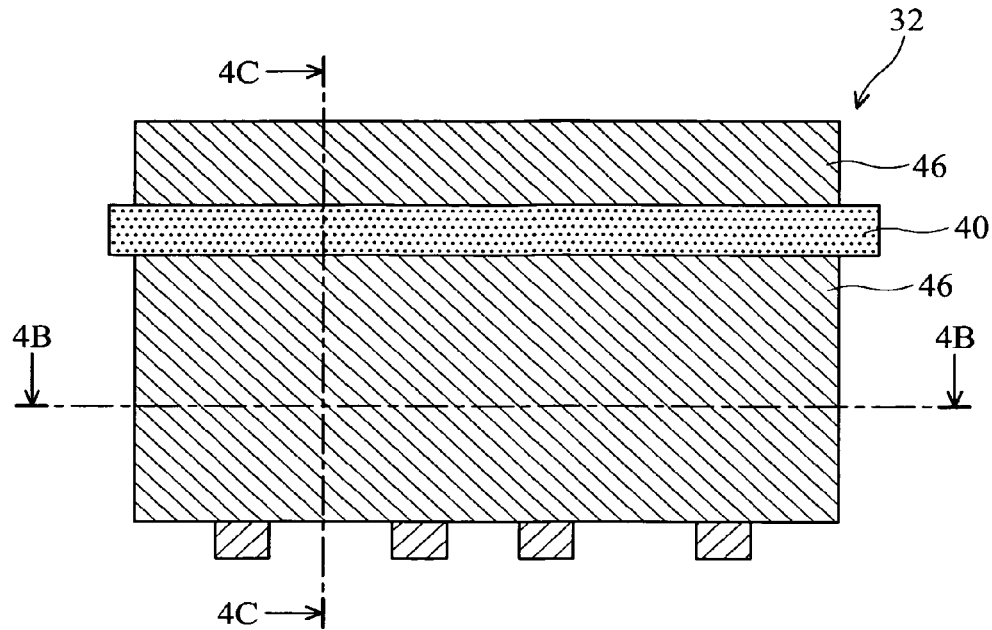
FIG. 4A is a top view illustrating a suicide formation on the completed structure shown in FIG. 3A.
Figure 4B:
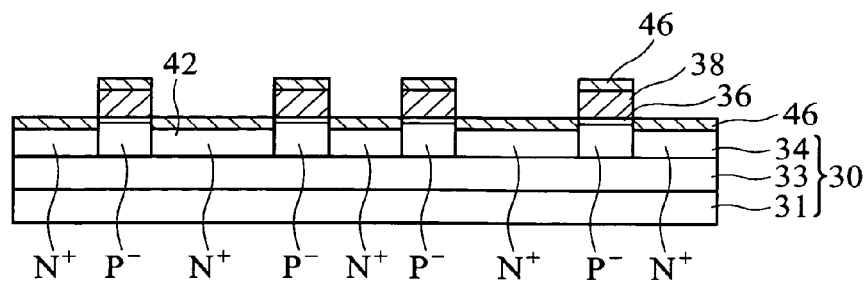
FIG. 4B is a cross-sectional diagram along line 4B-4B of FIG. 4A.
Figure 4C:
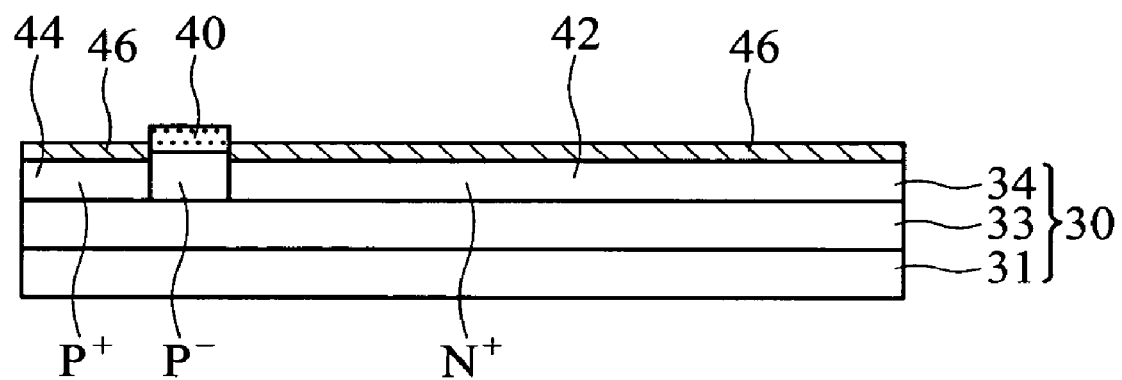
FIG. 4C is a cross-sectional diagram along line 4C-4C of FIG. 4A.

FIG. 4A is a top view illustrating a silicide formation on the completed structure shown in FIG. 3A, FIG. 4B is a cross-sectional diagram along line 4B-4B of FIG. 4A, and FIG. 4C is a cross-sectional diagram along line 4C-4C of FIG. 4A. First, a metal layer such as a refractory metal layer including cobalt, tungsten, titanium, nickel or the like is deposited over the entire surface through the use of RF sputtering, CVD, PVD or any advanced deposition technology. An annealing process, such as a rapid thermal anneal (RTA) method, is then performed, causing the deposited metal to be converted into its silicide wherever it is in direct contact with silicon. A selective etchant such as hydrogen peroxide is then used to remove all unreacted metal, i.e. all metal that is in contact with oxide rather than silicon, obtaining silicide regions 46 on the gate electrode layers 38, the source/drain regions 42 and the body contact region 44.

Figure 5A:
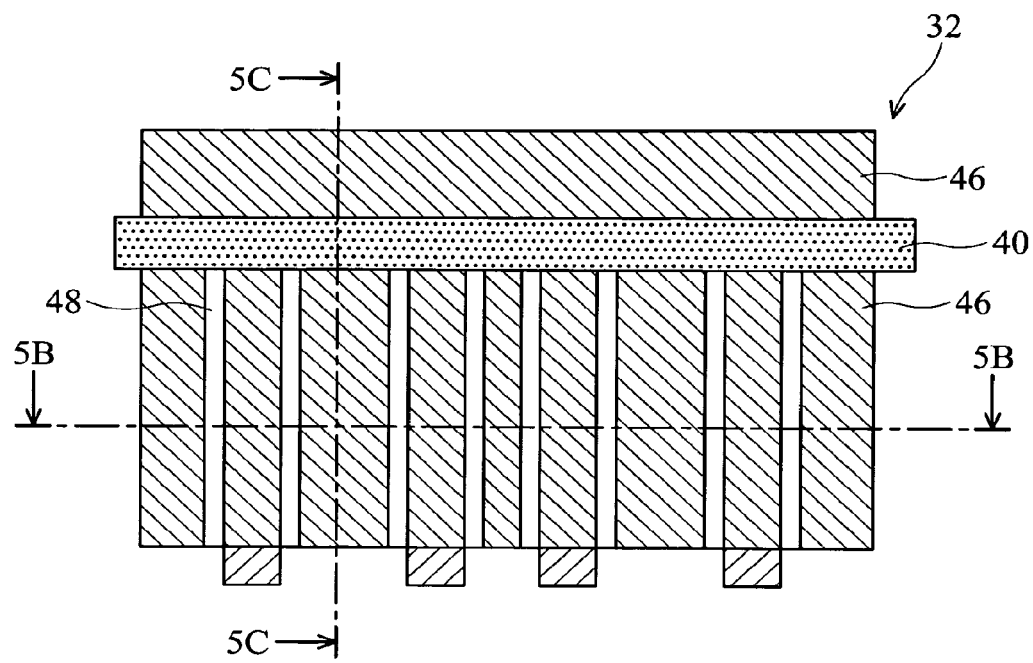
FIG. 5A is a top view illustrating a dielectric spacer formation and a silicide formation on the completed structure shown in FIG. 3A.
Figure 5B:
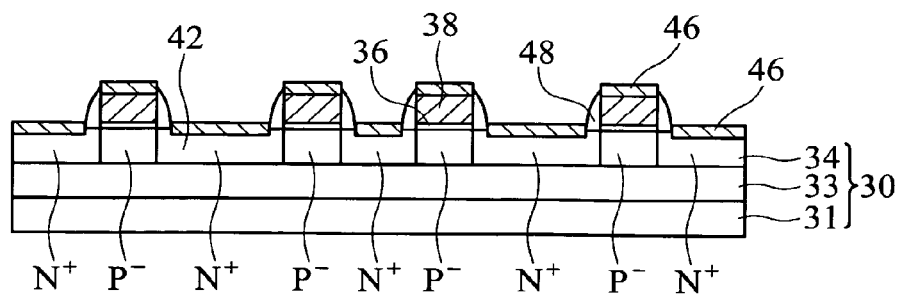
FIG. 5B is a cross-sectional diagram along line 5B-5B of FIG. 5A.
Figure 5C:
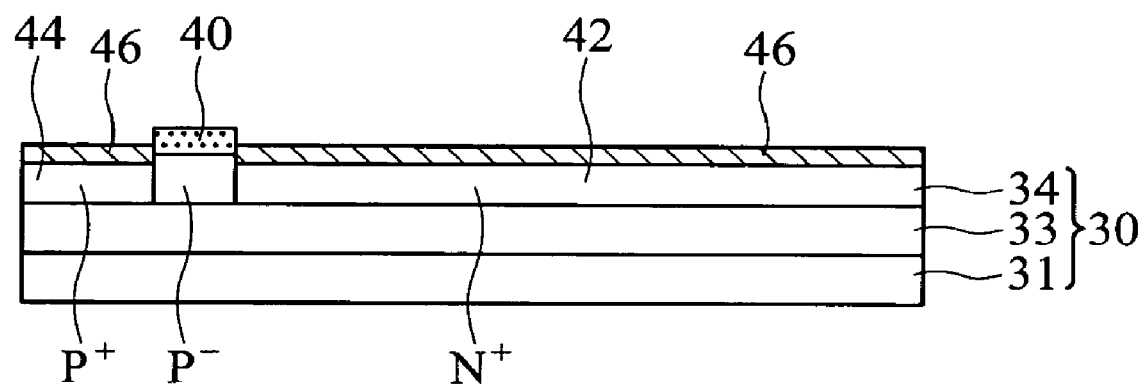
FIG. 5C is a cross-sectional diagram along line 5C-5C of FIG. 5A.

In one embodiment, dielectric spacers are provided on sidewalls of the gate structures prior to the formation of source/drain regions 42. FIG. 5A is a top view illustrating a dielectric spacer formation and a silicide formation on the completed structure shown in FIG. 3A, FIG. 5B is a cross-sectional diagram along line 5B-5B of FIG. 5A, and FIG. 5C is a cross-sectional diagram along line 5C-5C of FIG. 5A, while explanation of the same or similar portions to the description in FIGS. 3A-3C and FIGS. 4A-4C is omitted. Following the formation of gate structures, dielectric spacers 48 are formed along the sidewalls of the gate structures respectively. For example, a lightly doped ion implantation process may be performed with various dopant species into the semiconductor layer 34 to form LDD regions. The margins of the LDD regions are substantially aligned to the sidewall of the gate structures. Advances in deposition, lithography, masking techniques and dry etch processes are followed to form the dielectric spacers 48 along the sidewalls of the gate structures. The dielectric spacers 48 may be formed of a silicon nitride layer, a silicon oxide layer, a silicon oxynitride layer, alternating layers of silicon oxide and silicon nitride, or combinations thereof. A heavily doped ion implantation process is then performed with the dielectric spacers 48 and the gate structures as the mask to implant various dopant species into the semiconductor layer 34, resulting in the source/drain regions 42. Thus, in the subsequent salicide process, the silicide regions 46 are selectively formed on the surfaces of the gate electrode layers 38, source/drain regions 42 and the body contact region 44 to lower their resistance values, without forming on surfaces of the RPO layer 40 and the dielectric spacers 48.

Figure 6A:
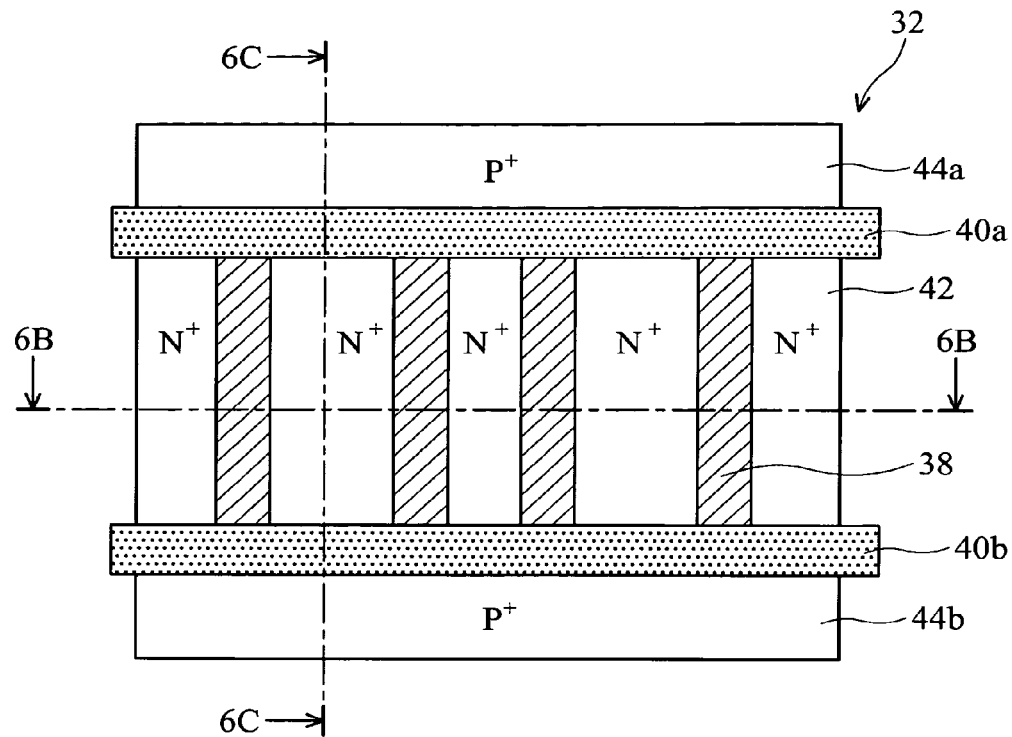
FIG. 6A is a top view illustrating a pair of RPO layers provided on the active region.
Figure 6B:
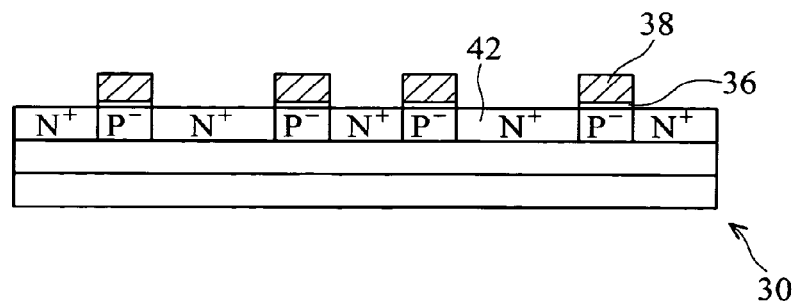
FIG. 6B is a cross-sectional diagram along line 6B-6B of FIG. 6A.
Figure 6C:
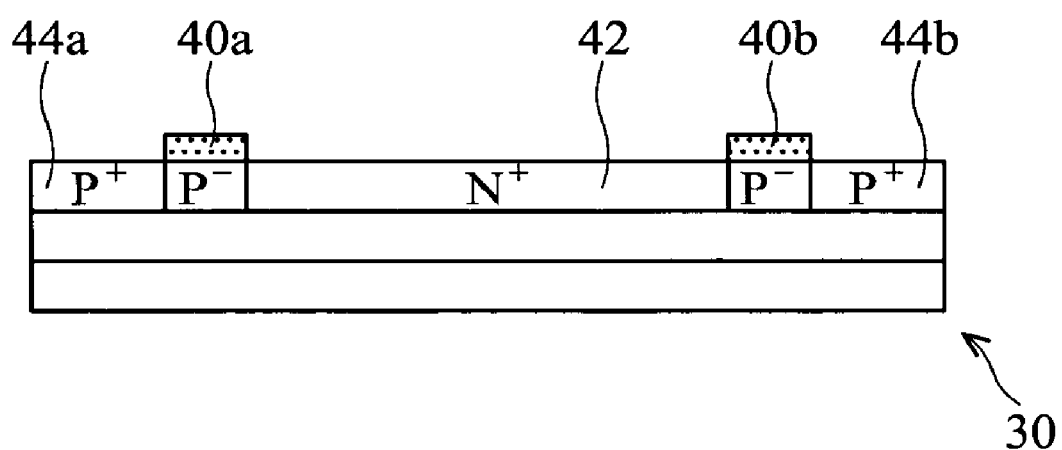
FIG. 6C is a cross-sectional diagram along line 6C-6C of FIG. 6A.

Embodiments of the present invention provide various modifications of the RPO pattern. In one embodiment, a pair of RPO layers 40a and 40b are provided on the active region 32 as depicted in FIGS. 6A, 6B and 6C, while explanation of the same or similar portions to the description in FIGS. 3A-3C is omitted. The first RPO layer 40a is a stripe-shaped layer across the first end of each gate electrode layer 38, thus distinguishing the source/drain regions 42 and the first body contact region 44a. Similarly, the second RPO layer 40b is a stripe-shaped layer across the second end of each gate electrode layer 38, thus distinguishing the source/drain regions 42 and the second body contact region 44b. That is, the gate electrode layers 38 are sandwiched between two parallel RPO layers 40a and 40b, thus creating four separated regions including one source region, one drain region and two body contact regions.

Figure 7A:
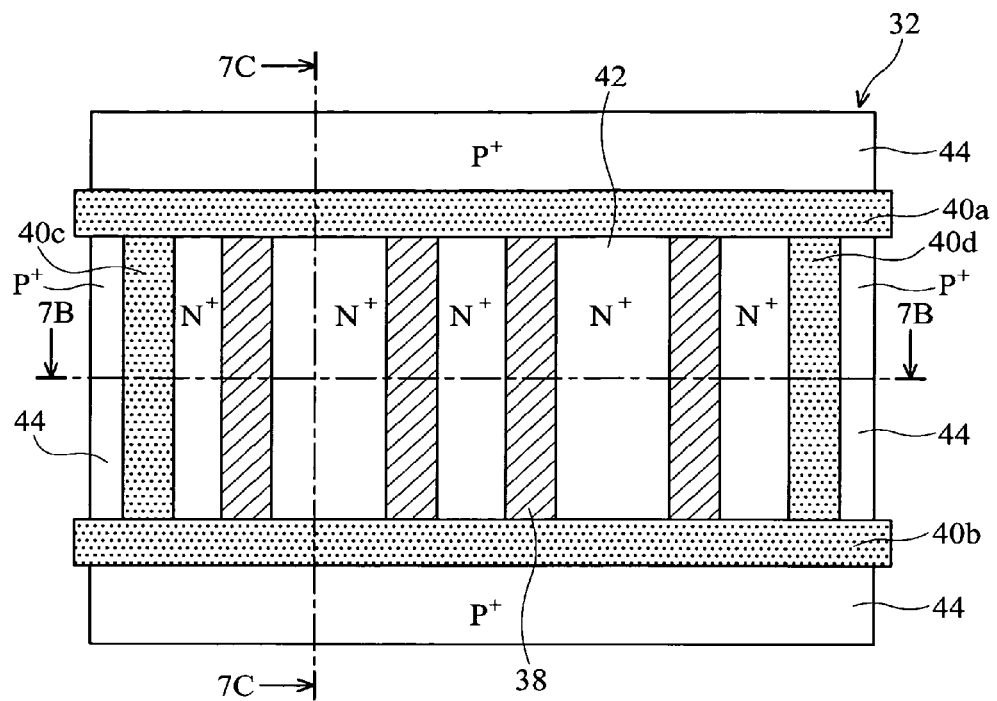
FIG. 7A is a top view illustrating four RPO layers provided on the active region.
Figure 7B:
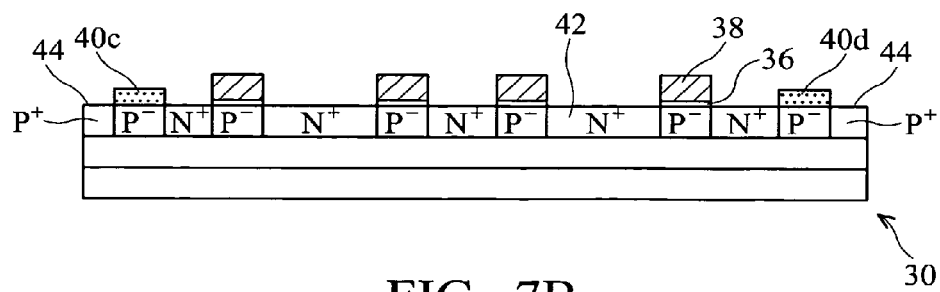
FIG. 7B is a cross-sectional diagram along line 7B-7B of FIG. 7A.
Figure 7C:
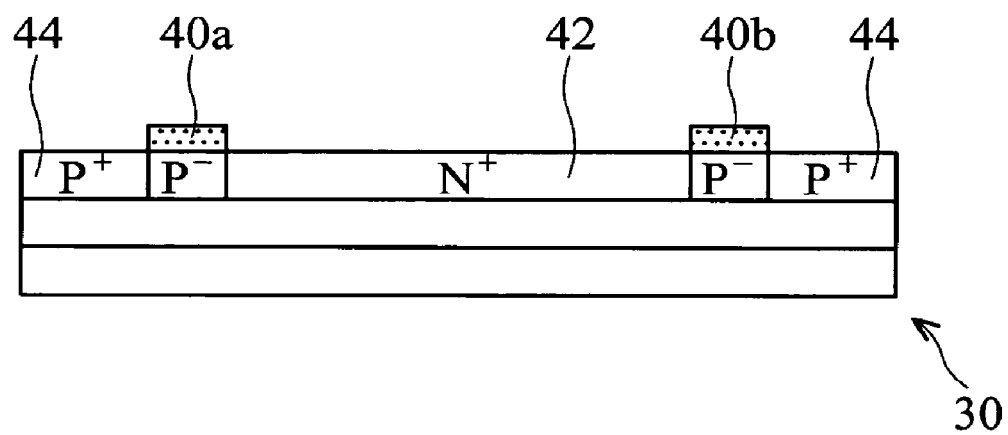
FIG. 7C is a cross-sectional diagram along line 7C-7C of FIG. 7A.

In one embodiment, another pair of RPO layers 40c and 40d are further provided between the two parallel RPO layers 40a and 40b as depicted in FIGS. 7A, 7B and 7C, while explanation of the same or similar portions to the description in FIGS. 6A-6C is omitted. The third RPO layer 40c is a stripe-shaped layer laterally adjacent to the left-most gate electrode layer 38 and connected to the two parallel RPO layers 40a and 40b. Similarly, the fourth RPO layer 40c is a stripe-shaped layer laterally adjacent to the right-most gate electrode layer 38 and connected to the two parallel RPO layers 40a and 40b. The arrangement of the four RPO layers 40a, 40b 40c and 40d forms a closed loop, thus source/drain regions 42 are distinguished by the gate electrode layers 38 inside this closed loop, and four separated body contact regions 44 are created outside this closed loop.

Figure 8A:
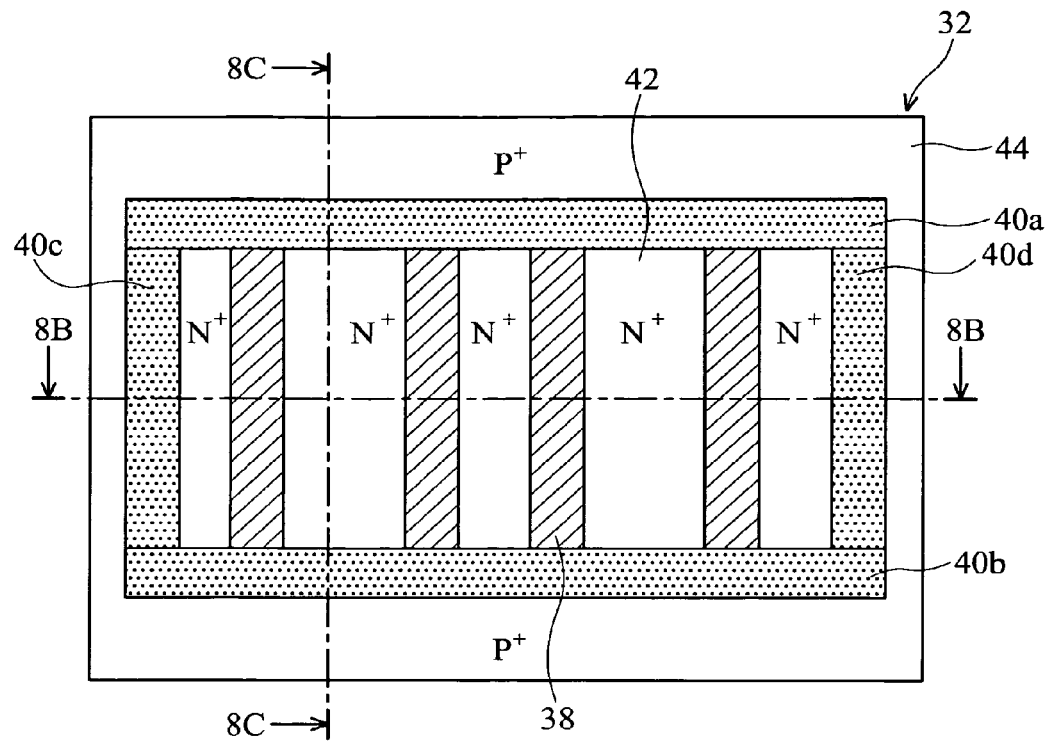
FIG. 8A is a top view illustrating a modification of four RPO layers for forming a circle-like body contact region.
Figure 8B:
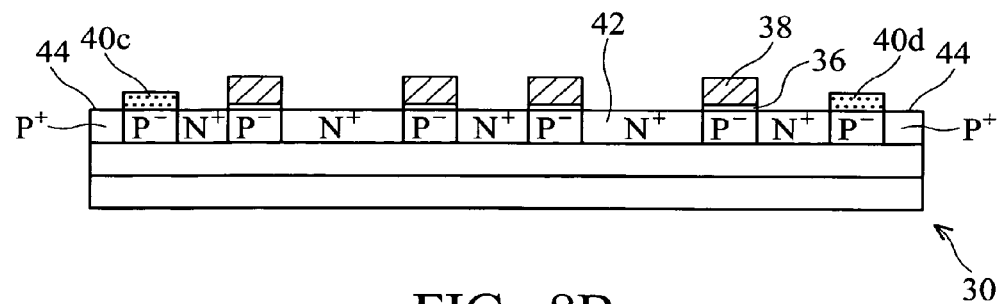
FIG. 8B is a cross-sectional diagram along line 8B-8B of FIG. 8A.
Figure 8C:
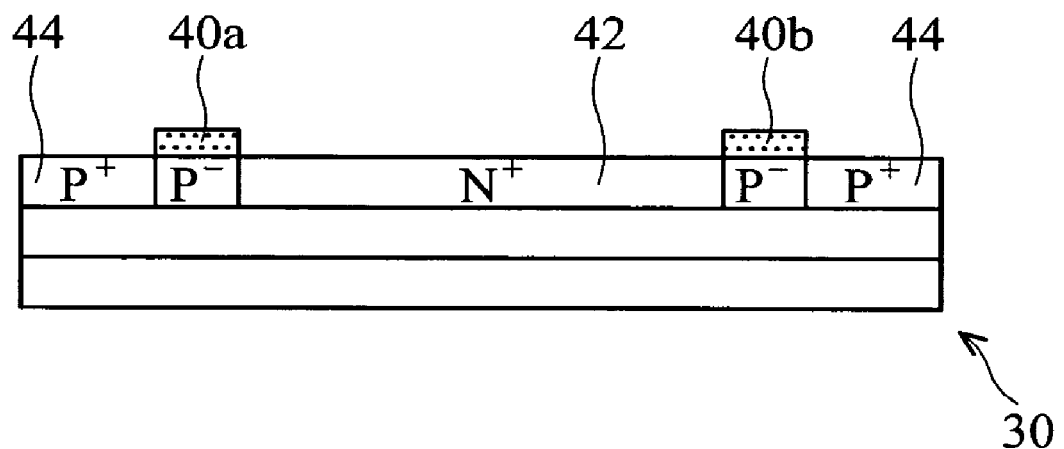
FIG. 8C is a cross-sectional diagram along line 8C-8C of FIG. 8A.

In one embodiment, the arrangement of the four RPO layers 40a, 40b 40c and 40d are modified to form the four body contact regions 44 as a continuous region (e.g., a circle-like body contact region) as depicted in FIGS. 8A, 8B and 8C. For example, the two ends of the first RPO layer 40a are substantially aligned to the outer sidewalls of the third RPO layer 40c and the fourth RPO layer 40d, respectively. Similarly, the two ends of the second RPO layer 40b are substantially aligned to the outer sidewalls of the third RPO layer 40c and the fourth RPO layer 40d, respectively. Therefore, the rectangular-loop RPO pattern can define a circle-like body contact region 44.

Figure 9A:
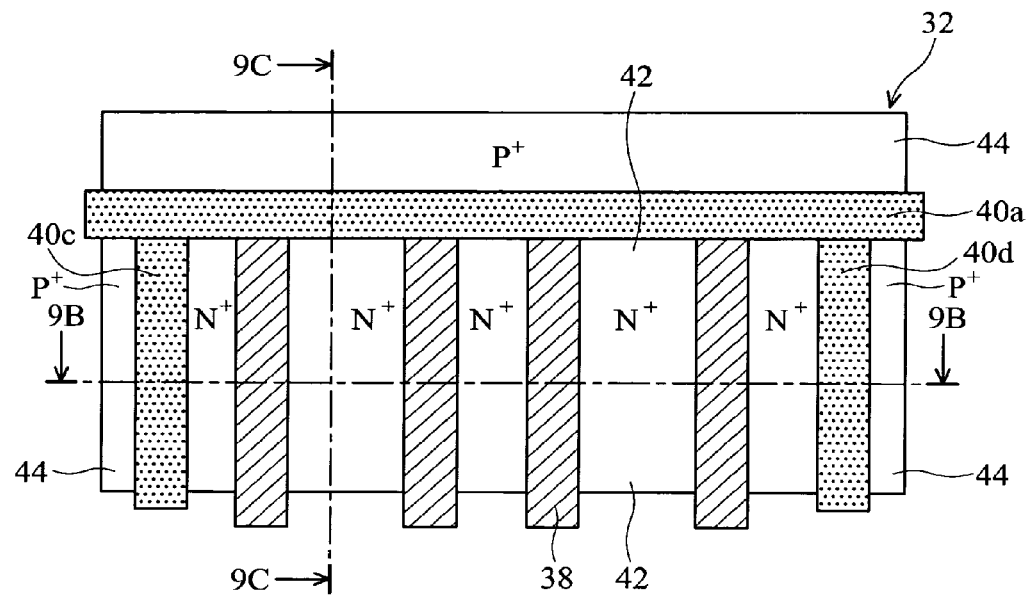
FIG. 9A is a top view illustrating three RPO layers provided on the active region.
Figure 9B:
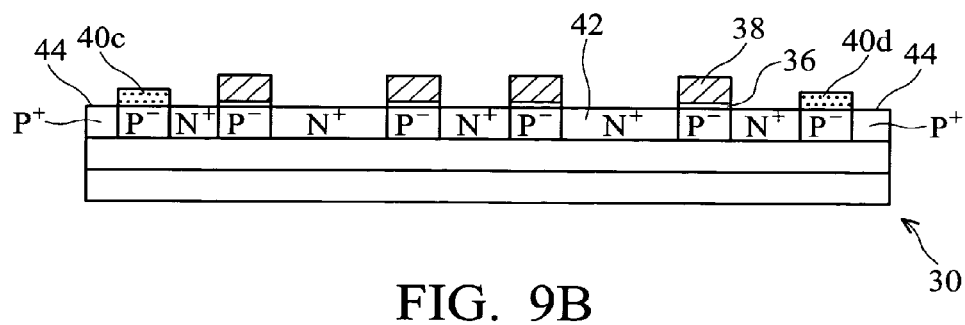
FIG. 9B is a cross-sectional diagram along line 9B-9B of FIG. 9A.
Figure 9C:
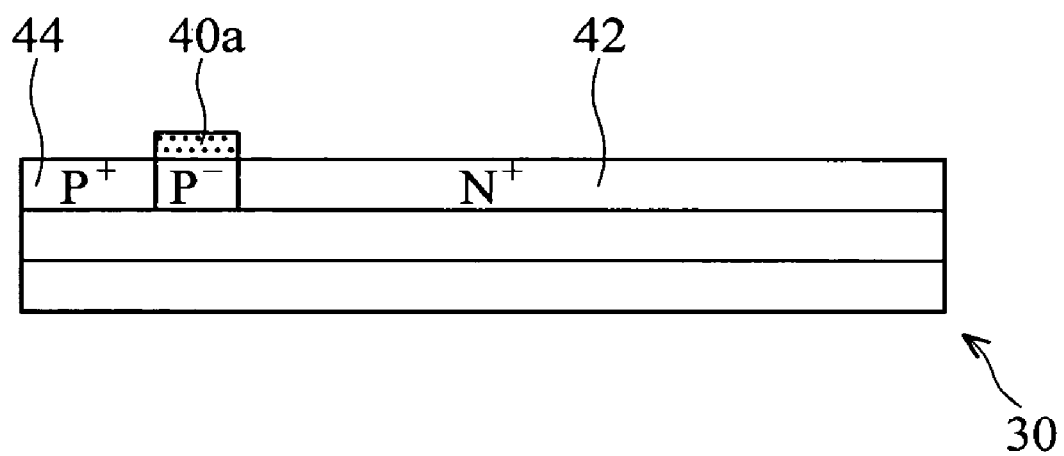
FIG. 9C is a cross-sectional diagram along line 9C-9C of FIG. 9A.
Figure 10A:
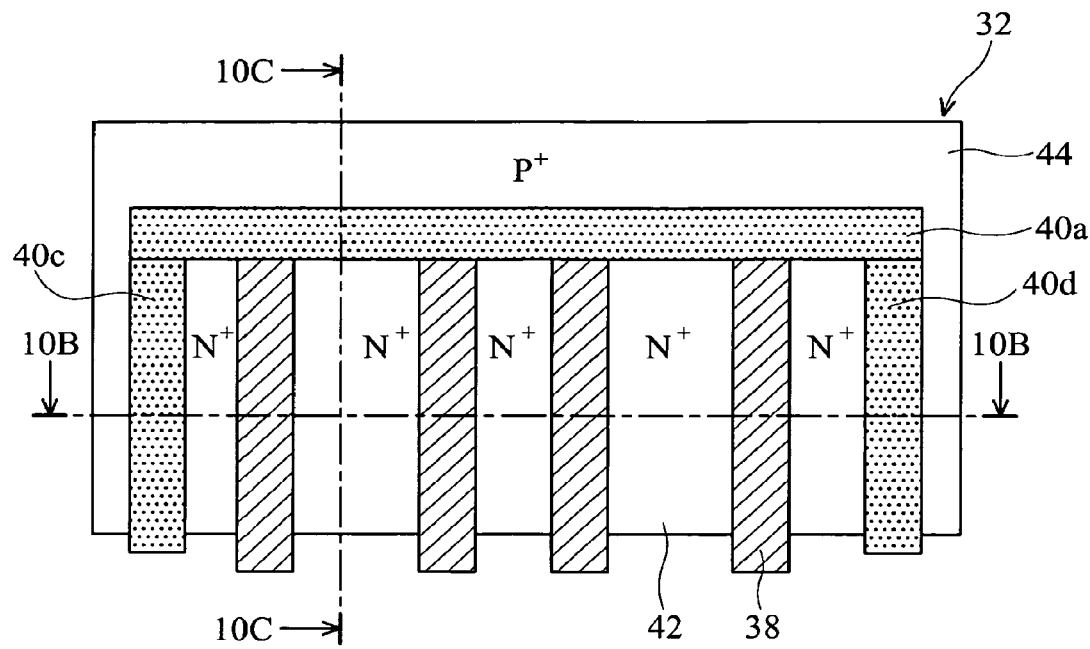
FIG. 10A is a top view illustrating a modification of three RPO layers for forming a reversed U-shaped body contact region.
Figure 10B:
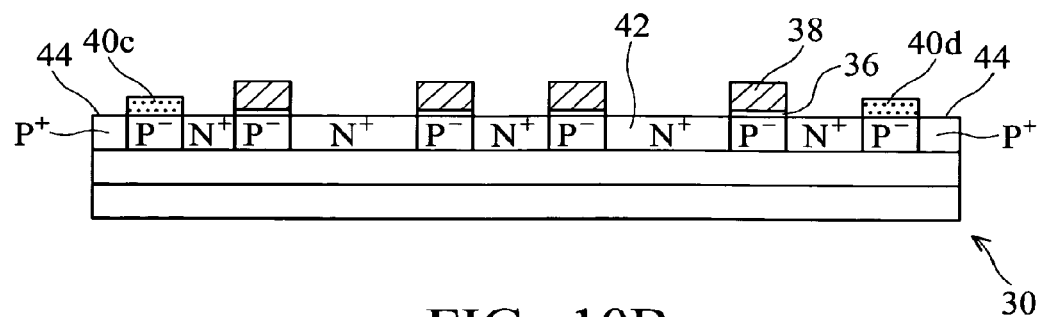
FIG. 10B is a cross-sectional diagram along line 10B-10B of FIG. 10A.
Figure 10C:
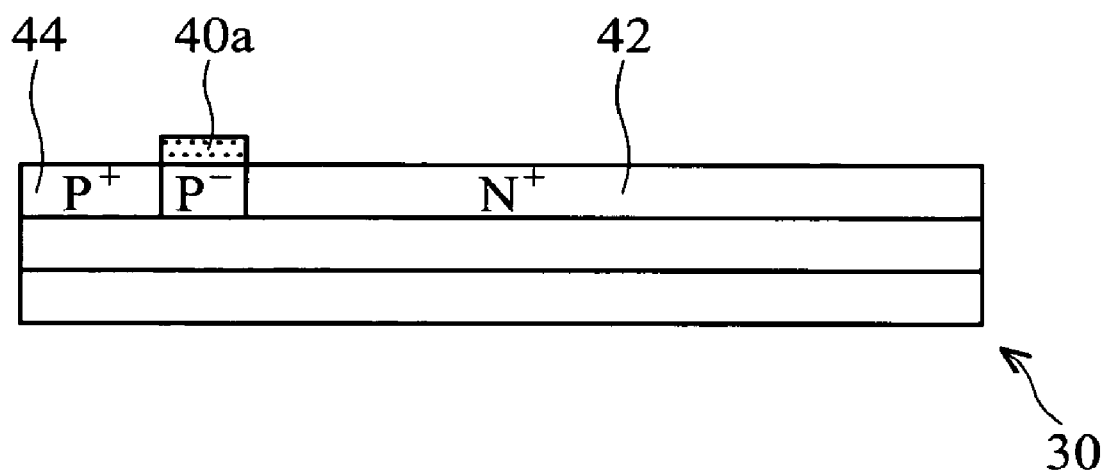
FIG. 10C is a cross-sectional diagram along line 10C-10C of FIG. 10A.

In one embodiment, the second RPO layer 40b is removed from the active area 32, as depicted in FIGS. 9A, 9B and 9C, thus the three RPO layers 40a, 40c and 40d create three separated body contact regions 44. In one embodiment, the arrangement of the three RPO layers 40a, 40c and 40d can be further modified to change the three separated body contact regions 44 into a continuous region, as depicted in FIGS. 10A, 10B and 10C. For example, the two ends of the first RPO layer 40a are substantially aligned to the outer sidewalls of the third RPO layer 40c and the fourth RPO layer 40d respectively. Therefore, the reversed U-shaped RPO pattern can define a reversed U-shaped (e.g., a door-like loop) body contact region 44.

Figure 11A:
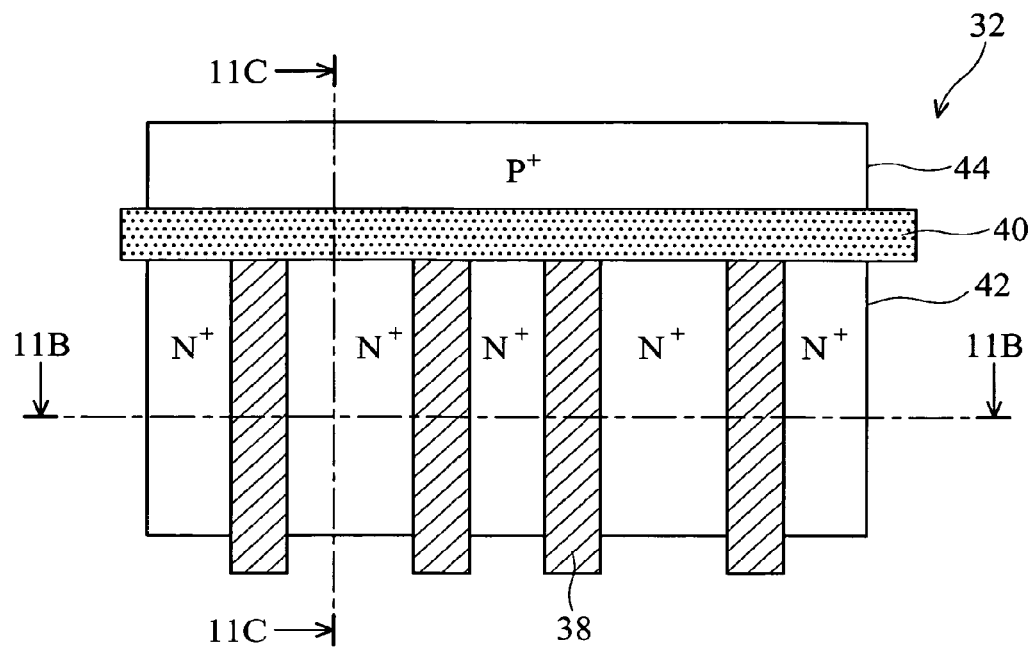
FIG. 11A is a top view illustrating a partial depletion type SOI device.
Figure 11B:
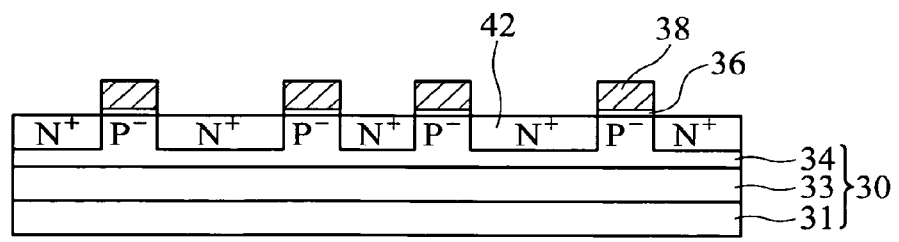
FIG. 11B is a cross-sectional diagram along line 11B-11B of FIG. 11A.
Figure 11C:
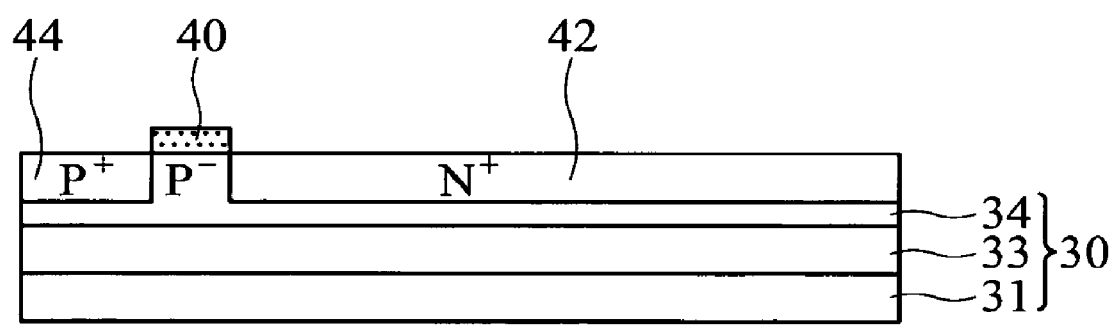
FIG. 11C is a cross-sectional diagram along line 11C-11C of FIG. 11A.

A transistor wherein the maximum depletion layer width is greater than the thickness of the semiconductor layer at the channel region is called a full depletion type SOI transistor, while a transistor wherein the maximum depletion layer width is smaller than the thickness of the semiconductor layer at the channel region is called a partial depletion type SOI transistor. The above-described embodiments use the full depletion type SOI devices where channel parts are fully depleted, but the partial depletion type SOI devices may be used in all embodiments of the present invention if dispersion of the threshold voltage can be suppressed. FIG. 11A is a top view illustrating a partial depletion type SOI device, FIG. 11B is a cross-sectional diagram along line 11B-11B of FIG. 11A, and FIG. 11C is a cross-sectional diagram along line 11C-11C of FIG. 11A. For a full depletion type SOI transistor, a thickness of the semiconductor layer may be made thin such as the same as or smaller than approximately 50 nm, thus a short channel effect can be reduced. By comparison, the partial depletion type SOI transistor may need a thicker semiconductor layer of more than 50 nm and generally requires a body contact.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A silicon-on-insulator (SOI) chip, comprising:
    a SOI substrate having an active area, wherein said SOI substrate comprises a semiconductor layer overlying an insulator layer;
    at least two dielectric layers resistant to silicidation over said semiconductor layer of said active area;
    at least one transistor located between said dielectric layers resistant to silicidation, wherein said transistor comprises a gate electrode layer over said semiconductor layer, a source region and a drain region in said semiconductor layer;
    at least two body contact regions in said semiconductor layer of said active area and separated from said source region and said drain region by said dielectric layers resistant to silicidation,
    wherein said at least two dielectric layers resistant to silicidation comprises:
    a first dielectric layer resistant to silicidation across one end of said gate electrode layer; and
    a second dielectric layer resistant to silicidation across the other end of said gate electrode layer;
    wherein, said gate electrode layer, said source region and said drain region are located between said first dielectric layer resistant to silicidation and said second dielectric layer resistant to silicidation,
    a third dielectric layer resistant to silicidation laterally adjacent to one sidewall of said gate electrode layer and connected to said first dielectric layer resistant to silicidation and said second dielectric layer resistant to silicidation; and
    a fourth dielectric layer resistant to silicidation laterally adjacent to the other sidewall of said gate electrode layer and connected to said first dielectric layer resistant to silicidation and said second dielectric layer resistant to silicidation;
    wherein, said first dielectric layer resistant to silicidation, said second dielectric layer resistant to silicidation, said third dielectric layer resistant to silicidation and said fourth dielectric layer resistant to silicidation are arranged in a form to enclose said gate electrode layer, said source region and said drain region.

2. The SOI chip of claim 1, wherein said at least two body contact regions comprises:
    a first body contact region separated from said source region and said drain region by said first dielectric layer resistant to silicidation; and
    a second body contact region separated from said source region and said drain region by said second dielectric layer resistant to silicidation;
    wherein said first body contact region is separated from said second body contact region.

3. The SOI chip of claim 1, wherein said at least two body contact regions comprises:
    a third body contact region separated from said source region and said drain region by said first dielectric layer resistant to silicidation, said second silicide-forbidden layer and said third dielectric layer resistant to silicidation; and
    a fourth body contact region separated from said source region and said drain region by said first dielectric layer resistant to silicidation, said second silicide-forbidden layer and said fourth dielectric layer resistant to silicidation.

4. A silicon-on-insulator (SOI) chip, comprising:
a SOI substrate having an active area, wherein said SOI substrate comprises a semiconductor layer overlying an insulator layer;
at least two dielectric layers resistant to silicidation over said semiconductor layer of said active area;
at least one transistor located between said dielectric layers resistant to silicidation, wherein said transistor comprises a gate electrode layer over said semiconductor layer, a source region and a drain region in said semiconductor layer;
at least two body contact regions in said semiconductor layer of said active area and separated from said source region and said drain region by said dielectric layers resistant to silicidation,
wherein said at least two dielectric layers resistant to silicidation comprises:
a first dielectric layer resistant to silicidation across one end of said gate electrode layer; and
a third dielectric layer resistant to silicidation laterally adjacent to one sidewall of said gate electrode layer and connected to said first dielectric layer resistant to silicidation; and
a fourth dielectric layer resistant to silicidation laterally adjacent to the other sidewall of said gate electrode layer and connected to said first dielectric layer resistant to silicidation;
wherein, said first dielectric layer resistant to silicidation, said third dielectric layer resistant to silicidation and said fourth dielectric layer resistant to silicidation are arranged in a form to surround said gate electrode layer, said source region and said drain region.

5. The SOI chip of claim 4, wherein said at least two body contact regions comprises:
a first body contact region separated from said source region and said drain region by said first dielectric layer resistant to silicidation;
a third body contact region separated from said source region and said drain region by said first dielectric layer resistant to silicidation and said third dielectric layer resistant to silicidation; and
a fourth body contact region separated from said source region and said drain region by said first dielectric layer resistant to silicidation and said fourth dielectric layer resistant to silicidation.

6. The SOI chip of claim 1, wherein each of said dielectric layers resistant to silicidation is a resist protective oxide (RPO) layer.

7. The SOI chip of claim 1, further comprising silicide regions on said gate electrode layer, said source regions, said drain region and said body contact region.

8. The SOI chip of claim 1, wherein said transistor is a full depletion type transistor or a partial depletion type transistor.

* * * * *